US007221038B2

(12) United States Patent
Auberton-Herve

(10) Patent No.: US 7,221,038 B2
(45) Date of Patent: May 22, 2007

(54) METHOD OF FABRICATING SUBSTRATES AND SUBSTRATES OBTAINED BY THIS METHOD

(75) Inventor: André Auberton-Herve, Meylan (FR)

(73) Assignee: S.O.I.Tec Silicon on Insulator Technologies S.A., Bernin (FR)

(*) Notice: Subject to any disclaimer, the term of this patent is extended or adjusted under 35 U.S.C. 154(b) by 0 days.

(21) Appl. No.: 11/057,171

(22) Filed: Feb. 15, 2005

(65) Prior Publication Data

US 2005/0151155 A1 Jul. 14, 2005

Related U.S. Application Data

(63) Continuation of application No. 10/320,063, filed on Dec. 16, 2002, now Pat. No. 6,936,482, which is a continuation of application No. PCT/FR01/01876, filed on Jun. 15, 2001.

(30) Foreign Application Priority Data

Jun. 16, 2000 (FR) .................................. 00 07755

(51) Int. Cl.
*H01L 29/06* (2006.01)

(52) U.S. Cl. .............................. 257/618; 257/E25.006

(58) Field of Classification Search ................ 257/618; 438/455

See application file for complete search history.

(56) References Cited

U.S. PATENT DOCUMENTS 5,298,449 A 3/1994 Kikuchi ...................... 437/63
5,374,564 A 12/1994 Bruel ......................... 437/24
6,048,411 A 4/2000 Henley et al. ............ 148/33.5
6,083,324 A * 7/2000 Henley et al. ............ 148/33.2
6,191,007 B1 * 2/2001 Matsui et al. ............... 438/459
6,251,754 B1 6/2001 Ohshima et al. ............ 438/506
6,534,381 B2 3/2003 Cheung et al. ............. 438/455
6,548,382 B1 * 4/2003 Henley et al. .............. 438/526

FOREIGN PATENT DOCUMENTS

FR 2 681 471 3/1993

OTHER PUBLICATIONS

Di Cioccio et al., "Silicon carbide on insulator formation using the Smart Cut process," Electronics Letters, vol. 32, No. 12, pp. 1144-1145 (1996).

Di Cioccio et al., "Silicon carbide on insulator formation by the Smart-Cut® process," Materials Science and Engineering B46, pp. 349-356 (1997).

(Continued)

*Primary Examiner*—W. David Coleman
(74) *Attorney, Agent, or Firm*—Winston & Strawn LLP

(57) ABSTRACT

Techniques are shown in which substrates having a first layer of a first material and second layer of a second material, wherein the second material is less noble than the first material, is provided by bonding the first and second layers together with an amorphous layer interposed there between. The amorphous material may be deposited on a bonding face of the first layer, second layer, or both, before the operation of bonding the first and second layers. The layer with less noble material may be a supporting layer and the other layer may be an active layer for forming components in optics, electronics, or opto-electronics. The amorphous layer may be polished before the bonding operation.

14 Claims, 5 Drawing Sheets

OTHER PUBLICATIONS

Fujino et al., "Silicon wafer direct bonding through the amorphous layer," Jpn. J. Appl. Phys., vol. 34, L1322-L1324 (1995).

Inoue et al., "Characteristics of new dielectric isolation wafers for high voltage power IC's by single-Si poly-Si direct bonding (SPSDB) technique," IEEE Transactions on Electron Devices, vol. 42, No. 2, pp. 356-358 (1995).

Ismail et al., "Polysilicon and titanium disilicide+polycide fusion bonding for 3-D microdevices applications," Solid-State Sensor and Actuator Workshop, 5th Technical Digest., IEEE, pp. 86-89 (1992).

Jones et al., "Bonding of thin films on 200 mm silicon wafers using chemical mechanical polishing," Proceedings 1998 IEEE International SOI Conference, pp. 161-162 (1998).

Yasseen et al., "Chemical-mechanical polishing for polysilicon surface micromachining," J. Electrochem. Soc., vol. 144, No. 1, pp. 237-242 (1997).

Zorman et al., "Fabrication of 3C-SiC on $SiO_2$ structures using wafer bonding techniques," Materials Science Forum, vols. 264-268, pp. 223-226 (1998).

* cited by examiner

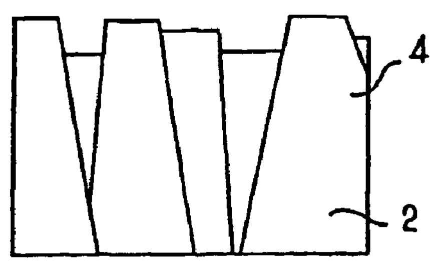
a)
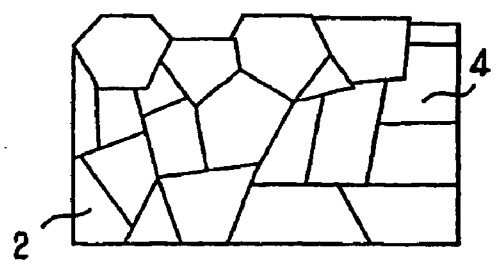
b)
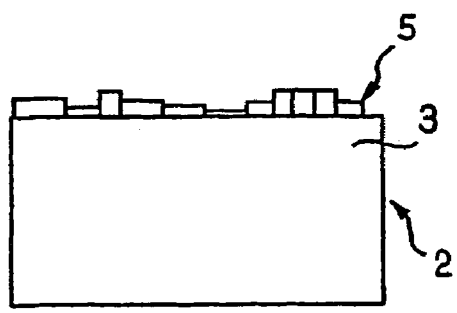
c)
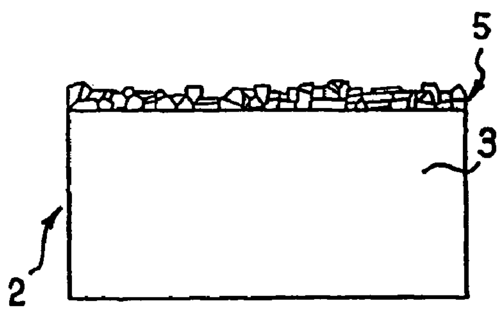
d)
FIG_1

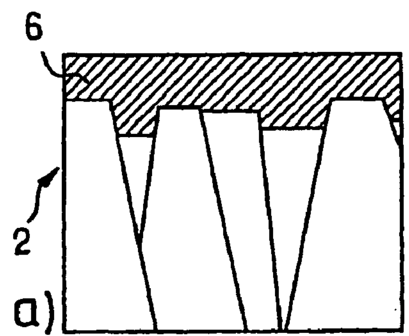
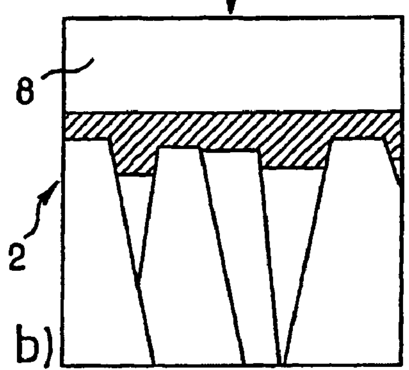
FIG_2
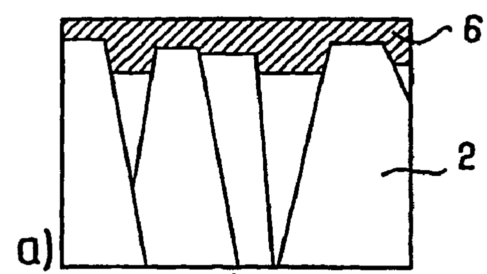
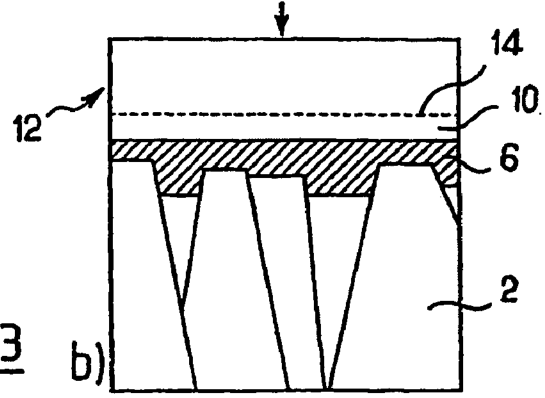
FIG_3
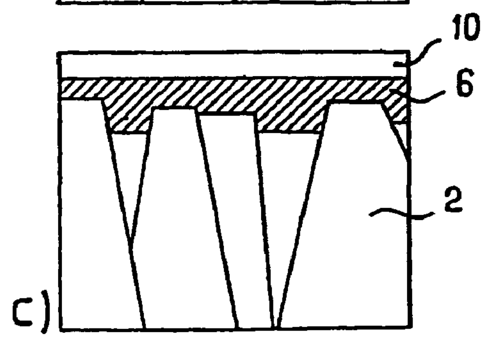

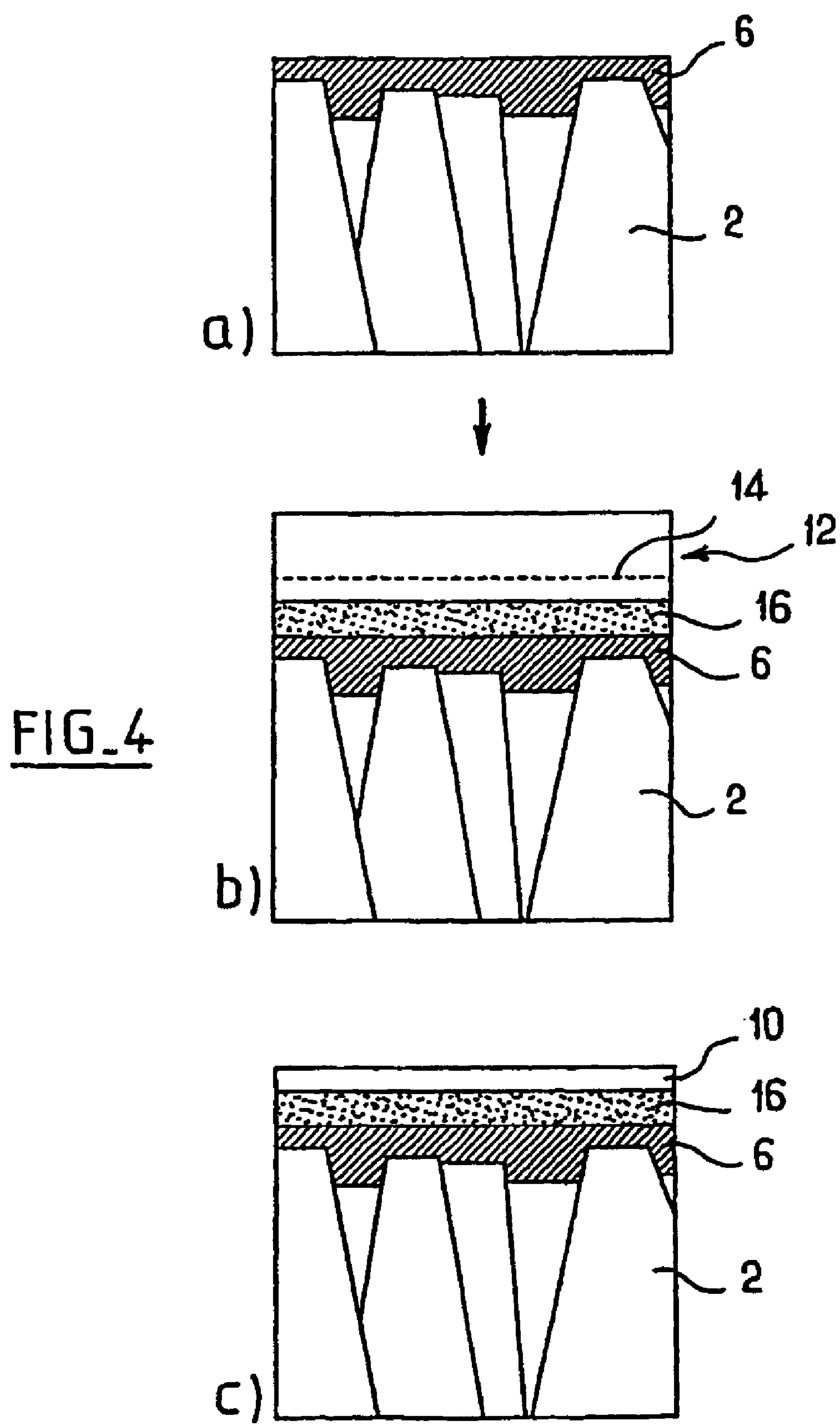
6
2
a)
14
12
16
6
FIG_4
2
b)
10
16
6
2
c)

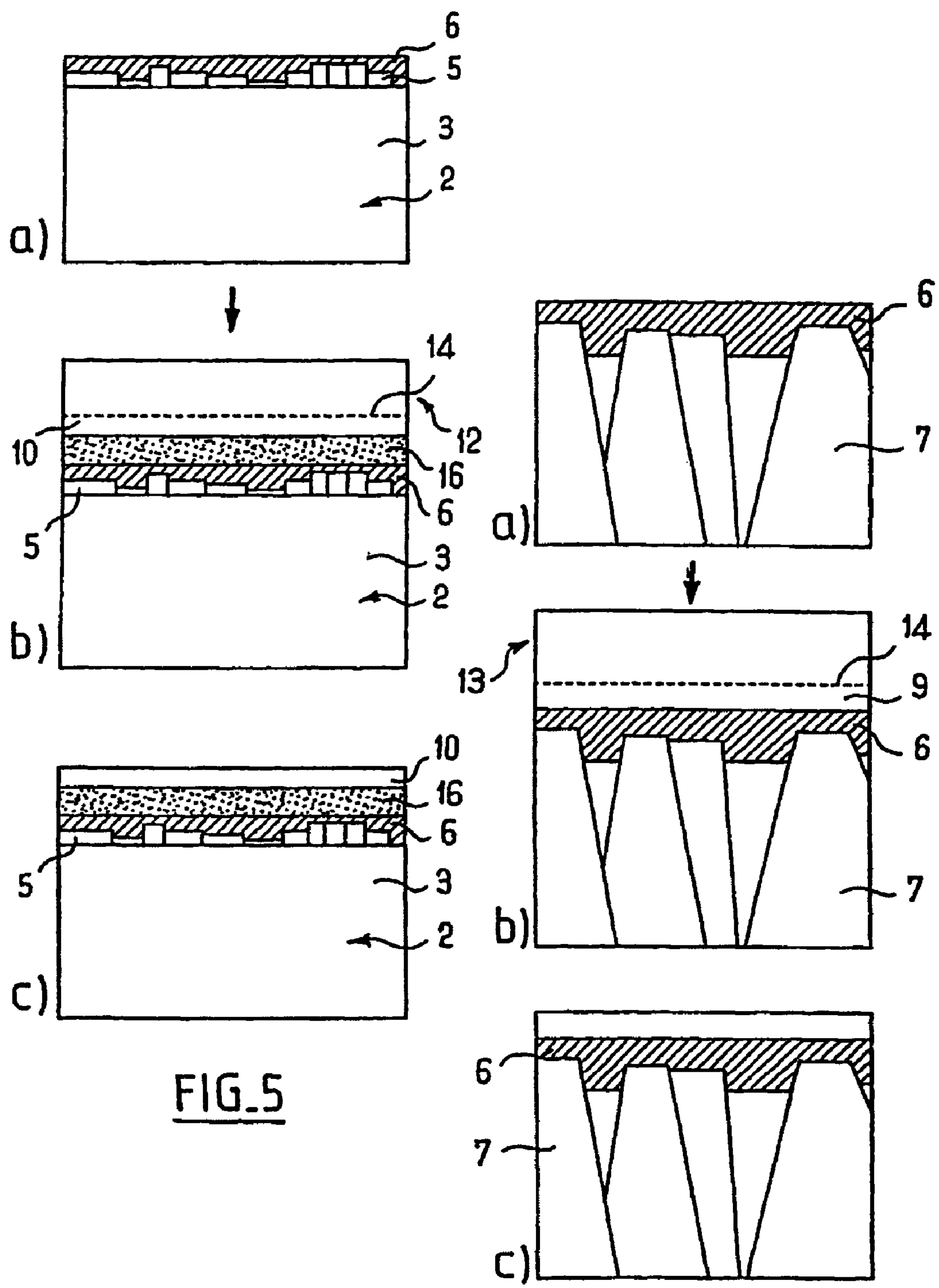
6
5
3
2
a)
14
12
10
16
6
5
3
2
b)
10
16
6
5
3
2
c)
FIG_5
6
7
a)
14
13
9
6
7
b)
6
7
c)
FIG_6

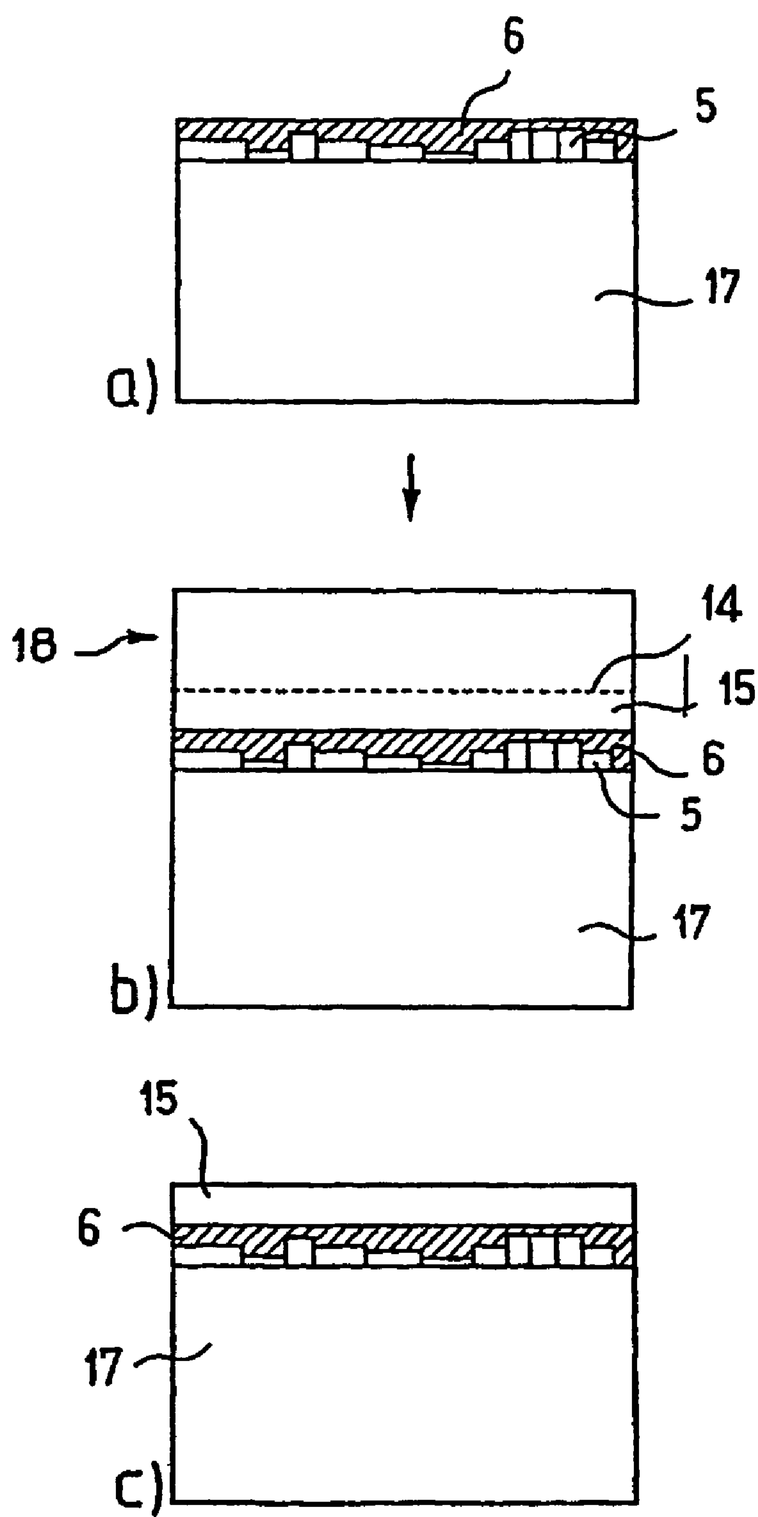
FIG_7

METHOD OF FABRICATING SUBSTRATES AND SUBSTRATES OBTAINED BY THIS METHOD

CROSS-REFERENCE TO RELATED PATENT APPLICATION

This is a continuation of application Ser. No. 10/320,063 filed Dec. 16, 2002,now U.S. Pat. No. 6,936,482 which is a continuation of PCT Application No. PCT/FR01/01876 filed Jun. 15, 2001, both of which are hereby incorporated herein in their entireties.

BACKGROUND

The invention relates to methods of fabricating substrates, in particular for use in optics, electronics or opto-electronics. To be more precise, the invention relates to methods of fabricating substrates in which an active material element is transferred onto a support.

One aspect of what is shown herein relates to a need for reducing the unit cost of such substrates in combination with obtaining a good bond between the support and the active material element of such substrates. A method of fabricating substrates may be sought, in particular for use in optics, electronics or opto-electronics, that is to include an operation of bonding an active element of a first material onto one face of a support including a second material, where the second material is less noble than the first material.

The expression "less noble" is used in this document to designate:

- a material of lower crystallographic quality; in this sense, for example, an amorphous material is less noble than a polycrystalline material, which is itself less noble than a monocrystalline material; or
- a material obtained by a simpler and/or faster method; according to this criterion monocrystalline silicon, for example, can be considered less noble than monocrystalline silicon carbide; note in particular that monocrystalline silicon is less costly than monocrystalline silicon carbide; or
- a material of lower crystallographic quality that is also obtained by a simpler and/or faster method; for example, a material obtained by a faster drawing method usually generates comparatively more defects; a material of this kind is also usually less costly, and is considered to be less noble; or
- a hybrid material including a layer or an area of material of lower crystallographic quality than the remainder, for example a monocrystalline substrate covered with a polycrystalline layer.

A less noble material is usually less costly.

Another aspect addresses problems associated with fabricating substrates, in particular for use in optics, electronics or opto-electronics, including an operation of bonding an active material layer onto a face of a support when at least one of these two elements is polycrystalline, at least at the surface of its face intended to be bonded, and problems associated with control of polishing.

SUMMARY

In accordance with the principles of the present invention, systems and methods may be provided for fabricating an optic, optoelectronic, or electronic substrate comprising a first layer of a first material; a second layer of a second material; and a deposited layer of electrically conductive amorphous material that is present between the first and second layer for direct bonding of the first and second layers together. Advantageously, the electrically conductive amorphous material is in direct contact with both the first and second layers and either the first or second layer, or both, comprises a polycrystalline face.

In one embodiment, the first layer is a polycrystalline SiC and the substrate further comprises an insulator layer between the first and second layers.

In another embodiment, the first material is a polycrystalline silicon, the second material is a monocrystalline silicon and the insulator layer is in direct contact with the second material and the amorphous material.

Each layer of the substrate preferably has a diameter of about 300 mm, and the insulator layer has a thickness of less than 1000 Å. Furthermore, no bonding defects are observable by infrared transmission.

Other objects, aspects and advantages of the invention will become apparent on reading the following detailed description.

BRIEF DESCRIPTION OF THE DRAWINGS

The invention will also be better understood with the aid of the drawings, in which:

FIGS. 1*a* to 1*d* are diagrammatic sectional views of four examples of support substrates for use in a transfer operation in accordance with the present invention;

FIGS. 2*a*–2*b* are diagrammatic sectional views showing the use of a polycrystalline material support substrate like that shown in FIG. 1*a* to implement a first embodiment of a method according to the invention;

FIGS. 3*a*–3*c* are diagrammatic sectional views showing the use of a support substrate like that shown in FIGS. 1*a* and 2 to implement a second embodiment of a method according to the invention;

FIGS. 4*a*–4*c* are diagrammatic sectional views showing the use of a support substrate like that shown in FIGS. 1*a*, 2 and 3 to implement a third embodiment of a method according to the invention;

FIGS. 5*a*–5*c* are diagrammatic sectional views showing the use of a support substrate like that shown in FIGS. 1*c* and 1*d* to implement a fourth embodiment of a method according to the invention;

FIGS. 6*a*–6*c* are diagrammatic sectional views showing the use of a support substrate like that shown in FIGS. 1*a* and 1*b* to implement a fifth embodiment of a method according to the invention; and FIGS. 7*a*–7*c* are diagrammatic sectional views showing the use of a support substrate like that shown in FIGS. 1*c* and 1*d* to implement a sixth embodiment of a method according to the invention.

DETAILED DESCRIPTION OF PREFERRED EMBODIMENTS

Another embodiment of the substrate includes a first layer of a first material and second layer of second material, which is less noble than the first material, wherein the layers are bonded together by interposing an amorphous material in between the first and second layers. The amorphous layer may have been deposited on the first or the second layer before bonding the layers together. The first layer may be a made of a monocrystalline material (e.g., silicon carbide) and the second material may be of made of a polycrystalline material (e.g., silicon).

A method of fabricating substrates may be achieved, in particular for use in optics, electronics or opto-electronics, that is to include an operation of bonding an active layer of a first material onto one face of a support including a second material, where the second material is less noble than the first material, and is to include before the operation of bonding, depositing an amorphous material onto the face of the support of the second material intended to receive the layer of the first material or depositing onto the face of the active layer of the first material intended to be bonded to the support, wherein the second material is less noble than the first material.

There is a wide and varied selection of less noble materials and the intended application and the corresponding fabricating technology can be essential factors conditioning the selection of a noble material.

Another aspect advantageously relates to a substrate, in particular for use in optics, electronics or opto-electronics, including:

an active layer, a support having a face made of a polycrystalline material, characterized in that it further includes an electrically conductive amorphous material or a material obtained from an amorphous material between the active element and the face made of the polycrystalline material.

Another aspect relates to a substrate, in particular for use in optics, electronics or opto-electronics, including:

an element made of a first material, a support made of a second material, characterized in that the second material is less noble than the first and in that it further includes an electrically conductive amorphous material or a material obtained from an amorphous material between the element made of the first material and the support made of the second material.

In another aspect, a method of fabricating substrates is shown, in particular for use in optics, electronics or opto-electronics, including an operation of bonding an active layer, comprising a first material over the whole of a bonding face, on a support, comprising a second material on a bonding face, characterized in that a second material less noble than the first material is chosen, and in that a layer of amorphous material is deposited on the bonding face of the support, or on the bonding face of the active element. The first material or the second material may be a polycrystalline material.

The amorphous material layer may be formed by a deposition process. The amorphous material layer may be formed by an amorphization process. The amorphous material may be amorphous silicon. The amorphous material deposited on the support may be polished before bonding. Polishing may be performed such that the operation removes from 200 to 5 000 Å, and preferably 1 000 Å, of amorphous material.

The combination of the support and the active layer joined together by the amorphous material may be heat treated. The heat treatment may be conducted at a sufficient temperature to crystallize the amorphous material at least partly. After bonding, a layer of the active element material may be detached from a part made of that material. Before bonding, implanting atomic species under the surface intended to be bonded to the support of the part at an implantation depth distributed around a particular depth. The layer of the first material then being detached at a detachment depth in the vicinity of the implantation depth.

The support may include a monocrystalline material covered with a layer of polycrystalline material. The support may, for example, be made of polycrystalline silicon, polycrystalline silicon carbide, and monocrystalline silicon. The active layer may, for example, be made of monocrystalline silicon or monocrystalline silicon carbide. The active material element may include a monocrystalline material layer and an insulator material layer such as an oxide layer. The support may include an insulator layer such as an oxide layer.

If desired, the amorphous material may be electrically conductive. A film of amorphous material may be used that is from 1000 to 5000 Å thick, and preferably 3000 Å thick.

Applications of methods in accordance with the invention can equally well cover the fabrication of silicon on insulator and the fabrication of quasi-substrates that are equivalent to massive substrates, in particular with no intermediate insulative layer.

An active layer of a first material may be bonded to a support layer of a second material by interposing an amorphous material, wherein the second material is less noble than the first material.

The choice of a less noble material is a function of many parameters, and for certain applications, certain parameters may be more important than others. If certain parameters are more important, monocrystalline material will carry the choice, but not if others are more important.

For example, in the case of transferring a layer of silicon carbide, and as in many other applications, some parameters of the second material, i.e. that of the support, should be equivalent to those of the first material, which in this case is monocrystalline silicon carbide.

Also, in the case of transferring a layer of monocrystalline silicon carbide, whether obtained from a massive substrate or from a layer grown epitaxially, a candidate advantageous for the less noble material support is a silicon substrate, even monocrystalline silicon, whose cost is undoubtedly highly competitive compared to a monocrystalline silicon carbide substrate.

Furthermore, in the case of transferring a layer of monocrystalline silicon carbide, the second material, i.e., that chosen for the support, must generally be able to withstand an exacting process for technological treatment of the layer of silicon carbide, because silicon carbide is a material having a high chemical inertia, is difficult to machine mechanically and chemically, etc. In particular, in the case of steps involving epitaxial growth of silicon carbide, for example, the second material must withstand treatment at a high temperature, which requires the second material to have a sufficiently high melting point, a suitable coefficient of thermal expansion, and possibly a suitable thermal conductivity. Similarly, if atoms are implanted in the silicon carbide to dope it, the second material may be required to undergo annealing at high temperature, which is equally exacting in respect of the coefficient of thermal expansion.

Moreover, the ideal candidate material for the second material should be able to replace the first material with minimum modifications and maximum transparency for the user in processes generally employed for treating substrates. The second material ideally satisfies as many as possible of the specifications defined by standards such as the SEMI standards corresponding to the specifications for a silicon substrate.

Over and above this transparency for the user, and over and above their low cost, according to such specifications, supports including or consisting of the second material must be compatible with existing plant for shaping and treating (polishing, cleaning, beveling, etc.) the substrates. In the case of transferring a silicon layer, it should ideally be possible to treat this kind of support on production lines that are dedicated to silicon and employ state of the art techniques.

To fabricate 300 mm diameter substrates covered with a layer of silicon, for example, one beneficial combination consists of transferring a layer obtained from a silicon substrate with few defects, for example an epitaxial silicon layer or a layer obtained from a substrate obtained by drawing, such as Czochralsky drawing, with few defects, onto a support of moderate cost, obtained in particular by drawing ingots at high speed, under conditions that are less than optimal in relation to the density of crystal defects. In this case, for 300 mm diameter silicon substrates to be accepted in a micro-electronics production line, they must meet very demanding conditions (purity in terms of contamination and particulate purity), and satisfy various constraints imposed by the various process steps (flatness for photolithography steps, mechanical strength for fast annealing, a particular reflectivity so as not to disrupt the photolithographic process or affect the operation of the various sensors for detecting substrates or alignments included in many types of equipment), etc.

Furthermore, supports including or consisting of the second material must advantageously be compatible with layer transfer operations, preferably including a direct bonding step, and most importantly must be compatible with the material of the element that they are intended to support (in this document, the expression "direct bonding" also refers to techniques known to the skilled person as "wafer bonding").

One aspect of this compatibility concerns the coefficients of thermal expansion in particular. Too great a difference renders the stack of the two materials unusable because it is likely to break as soon as the usual heat treatments are applied to it.

In most cases, and in particular in the case of fabricating 300 mm diameter substrates covered with a monocrystalline silicon layer, or in the case of substrates covered with a silicon carbide layer, another choice which is judicious from the point of view of transparency in the processing line and compatibility between the support and the layer is to use the same material, but in polycrystalline form (the economic saving is then compared to ingot drawing and/or epitaxy).

In accordance with the invention, substrates are advantageously made with one or more monocrystalline layers on a polycrystalline support. In this case, the monocrystalline layer(s) and the polycrystalline support can be made of the same material, for example.

In accordance with the invention, substrates are advantageously made with one or more monocrystalline layers on a monocrystalline support itself covered with a layer of polycrystalline material. This configuration has at least the following two advantages:

- the layer of polycrystalline material can constitute a layer for trapping metallic impurities, which is known to the skilled person as "gettering" and is very beneficial in some applications, and
- the layer of polycrystalline material can constitute an area for trapping degassed species during annealing operations, for example.

Having now considered the question of the choice of the less noble material, consider the choice of the amorphous material.

This is also a wide and varied choice.

The interface between the two is advantageously electrically conductive, in order to obtain better electrical conductivity between the active layer and its support, and/or thermally conductive. For many applications it is not essential for the interface to be exactly equivalent, in terms of performance, to a massive monocrystalline substrate. This applies in particular when some devices require a contact on the rear face to evacuate spurious charges or heat via the rear face.

In other cases, in particular in the case of fabricating silicon on insulator (SOI) substrates, the interface is not necessarily electrically conductive.

Another aspect of the invention relates to a method in which the active material element is bonded to the face of a polycrystalline material support.

Of the bonding techniques known to be compatible with final applications in micro-electronics, optics, electronics and opto-electronics, the most suitable are direct bonding techniques in which no adhesive is used. These techniques are relatively exacting in terms of the roughness and flatness of the surfaces to be brought into contact.

They generally necessitate polishing of the surfaces just before bonding or at an earlier stage in the fabrication of the substrates. When the aim is transfer to a monocrystalline support, for example a monocrystalline silicon support, the polishing techniques currently employed by all substrate manufacturers are sufficient, provided that they are accompanied by sufficiently stringent cleaning and that operations subsequent to cleaning are carried out in a sufficiently clean environment, to prevent contamination of the surfaces to be bonded by particles, hydrocarbons, etc.

On the other hand, if one of the bonding surfaces is that of a polycrystalline material, and most importantly if direct bonding is to be used, i.e. no adhesive, these direct bonding techniques become very difficult or even ineffective.

The above direct bonding problems arise whether the polycrystalline material is obtained by deposition techniques, such as chemical vapor deposition (CVD), or from an ingot of polycrystalline material that is then sliced and converted into substrates. These problems arise in particular if the polycrystalline material is polycrystalline silicon.

The problems are due to irregularities in the topology of the grains of the polycrystalline material. This is because the orientation of the grains is imperfect, the material features more or less extensive grain boundaries, etc. Thus when the surfaces of polycrystalline materials are polished, the polishing speed is found to be anisotropic in the various grains, over the grain boundaries, etc. These irregularities resulting from the polishing of the surface are accentuated if the polishing techniques have a chemical component. This is also the case during various etching, cleaning, etc. steps involved in forming the substrates or preparing the surface of a polycrystalline material for bonding.

The skilled person is very familiar with the problems to be mastered in polishing polycrystalline materials for direct bonding. They are described, for example, in Philips Journal of Research, Vol. 49, 1995 (for example, pages 13 to 15 and 26 to 38). The authors of the above paper explain the various classifications of polishing techniques and their impact on the quality of direct bonding. The problems have also been reported by researchers for whom the problem was not so much direct bonding onto a polycrystalline substrate as joining two silicon substrates using an intermediate layer of polycrystalline silicon deposited on one of the substrates. These difficulties are described in the following documents, for example:

J. Jiao et al., Proc. SPIE—Int. Soc. Opt. Eng., 3223 (1997) 245 Micromachining and Microfabrication Process technology III. Austin Tex. USA, 29–30 Sep. 97;

M. Salleh Isamil, Techn. Digest IEEE Solid state Sensor and Actuator Workshop (IEEE, New York N.Y. USA, 1992), pp 66–89 (Hilton Head Island, S.C., USA 22–25 Jun. 92);

W. G. Easter et al., Proceedings of the first international symposium on semiconductor wafer bonding, Science, Technology and Applications (Electrochem Society, Pennington, N.J. USA), pp 223–229: (Phoenix Ariz., 13–18 Oct. 91);

Y. Inoue, IEEE Trans. Electr. devices (1995), 356; and

K. N. Vinod, Transducers 97, 1997 International Conference on Solid State Sensors and Actuators (IEEE, New York N.Y. USA, 1997), vol. [sic], pp 653–656 (Chicago, Ill., USA, 16–19 Jun. 97).

In addition, a method of fabricating substrates may be provided, in particular for use in optics, electronics or opto-electronics, including an operation of bonding an active layer of a first material to one face of a support comprising a second material, characterized in that the active layer or the support includes a polycrystalline material at least on its face intended to be bonded and in that it further includes, prior to bonding, forming an amorphous material layer on the face or faces including the polycrystalline material.

This latter method in particular addresses the problems related to controlling polishing. An amorphous material is inherently isotropic and free of grain size irregularities. The bonding step can therefore be carried out directly on the amorphous material, regardless of whether the layer of amorphous material is obtained by deposition or by amorphization. However, if polishing is also necessary, the polishing should be uniform and provides a surface that is sufficiently flat for direct bonding regardless of whether the layer of amorphous material is obtained by deposition or amorphization. Depositing amorphous material also makes good topology irregularities.

The polycrystalline material and the amorphous material are advantageously deposited virtually simultaneously without stopping deposition, by varying only the temperature, for example by reducing the temperature at which the amorphous material is obtained relative to that at which the polycrystalline material is deposited.

The method according to the invention is particularly advantageous in the context of making low-cost substrates when a polycrystalline material is used for the substrate that is less noble than the material used for the active layer, for example.

Polycrystalline material substrates are generally less costly than monocrystalline material substrates. It is then possible to use a polycrystalline material substrate to support a layer or a stack of layers of one or more materials of better quality, for example of monocrystalline quality. The layer or stack of layers constitutes the active part of the substrate, i.e. it is this part that will be used, because of its physical properties, to produce structures for use in optics, electronics or opto-electronics.

For this type of application any layer transfer method can be used that employs bonding of the layer to a substrate. The Smart-Cut® method may be cited as one example, one use of which is described in U.S. Pat. No. 5,374,564, which is hereby incorporated herein in its entirety. It is particularly advantageous to use the Smart-Cut® method in combination with the present invention, because of the facility that it offers for recycling substrates. This is because, using the Smart-Cut® method, it is possible to transfer onto a support substrate only a layer that is to form the active part, that layer corresponding to only part of a source substrate, so that the remainder of the source substrate can be recycled, for example by taking off a new active layer, etc.

Being able to use a relatively low cost support in combination with multiple recycling of a source substrate, as offered by a Smart-Cut® method, is particularly advantageous in some applications. Such applications include, for example, the production of 300 mm diameter monocrystalline silicon substrates and monocrystalline silicon carbide substrates. Monocrystalline silicon substrates with large dimensions and monocrystalline silicon carbide substrates are characterized by the high cost of ingot growth. The cost is all the higher if an extreme crystalline quality is demanded, because it is these active layers that will support the active areas of future components. In the case of producing 300 mm diameter monocrystalline silicon substrates, for example, the silicon growth conditions must be optimized to minimize certain crystal defects.

Accordingly, in the particular case of drawing ingots, the ingots must be drawn particularly slowly, which is costly. For the two materials cited by way of example above, it is therefore a question of making "quasi-substrates" resembling monocrystalline silicon or monocrystalline silicon carbide substrates as closely as possible, but at minimum cost.

In another particular instance of what has been described above, the active layer is an epitaxial layer. This type of layer is known to have excellent crystalline qualities but its unit cost is particularly high. The epitaxial layer can be sampled many times (the possibility of recycling is based, for example, on reconditioning by etching, polishing, cleaning, annealing, smoothing in hydrogen, etc., or even regeneration of the epitaxial layer by further epitaxial growth on the same substrate).

The method according to the invention also applies with advantage to any material when it is fabricated with a new, greater diameter than has previously been obtained. There is a period of time in which the availability of high-quality material in the new diameter, which is associated with state of the art technologies and high investment, is limited, and the material is therefore costly.

The method according to the invention is also used with advantage to transfer silicon layers of high crystalline quality supporting an oxide layer onto a support incorporating the polycrystalline material at least on the face onto which the transfer is made, to form SOI structures.

Methods in accordance with the invention advantageously further include the following features, in isolation or in combination:

- they further include polishing the amorphous material deposited on the substrate before bonding the active material element; polishing removes from 200 to 5000 Å, and preferably 1000 Å, of amorphous material;
- a film of amorphous material from 1000 to 5000 Å thick, and preferably 3000 Å thick, is formed during deposition;
- they include heat treating the combination of the support and the active material element joined together by the amorphous material (the heat treatment is advantageously conducted at a sufficient temperature to crystalline the amorphous material at least partly);
- they include, after bonding, detaching a layer of active material from a part made of the active material;
- they include, before bonding, implanting atomic species under the surface intended to be bonded to the support of the part made of the active material at an implantation depth distributed around a particular depth, the layer of the active material then being detached at a detachment depth in the vicinity of the implantation depth.

The techniques in accordance with the present invention are illustratively described below with the aid of six particular but non-limiting embodiments.

The first, second, third and fifth embodiments concern a bonding process which involves transferring an active layer onto a polycrystalline support substrate.

The fourth and sixth embodiments concern a bonding process which involves transferring an active layer onto a support substrate having a layer of polycrystalline material on the face that receives the active layer.

The first embodiment of the invention is used for direct bonding of a monocrystalline silicon element onto a polycrystalline silicon support.

The support 2 is a disc, for example, with a diameter of 200 mm and a thickness of 725 microns.

The support 2 is shown diagrammatically and in section in FIGS. 1*a* and 1*b*. It features monocrystalline grains 4. The monocrystalline grains 4 can extend throughout the thickness of the support 2, as in a column-grown substrate, for example (FIG. 1*a*). However, the support 2 can equally well consist of grains 4 stacked in a disordered manner, one on another and/or one beside another.

It is entirely equivalent to use instead of the supports 2 described above with reference to FIGS. 1*a* and 1*b* supports 2 including a wafer 3 covered with a layer of polycrystalline material. Supports 2 of this kind are shown in FIGS. 1*c* and 1*d*. The supports 2 shown in FIGS. 1*c* and 1*d* also feature a polycrystalline silicon layer 5 consisting of monocrystalline grains 4 that can extend throughout the thickness of the polycrystalline silicon layer 5 (FIG. 1*c*) but which can equally well be stacked in a disordered manner one on another and/or one beside another (FIG. 1*d*).

Supports 2 of this kind are particularly advantageous for absorbing species produced during the degassing that can occur during various treatments, and in particular thermal treatments, of the substrate obtained after transferring the active layer onto the support 2.

It is equally possible to use supports 2 consisting of a wafer 3 with components, the whole being covered with a polycrystalline silicon layer 5, or consisting of an amorphous material wafer 3 also covered with a polycrystalline silicon layer 5, or consisting of a wafer 3 of a material chosen for its very good thermal conductivity and/or its transparency to light and/or some other physical property, also covered with a polycrystalline silicon layer 5.

In each case the polycrystalline silicon layer 5 is advantageously from 500 to a few thousand angstroms thick for use in microelectronics and a few tens of microns thick for photovoltaic applications.

Note that although the support 2 is polished, the surface is generally irregular, as it is in all the situations shown in FIG. 1.

When the support 2 is of massive polycrystalline silicon (FIGS. 1*a* and 1*b*), it typically has, after polishing, a surface topology with irregularities whose height can, in the worse case scenario, vary within a range of 500 Å.

However, less than a few tens of angstroms are sufficient to spoil direct bonding.

In the method according to the invention, a 3000 Å thick amorphous silicon layer 6 is then deposited on the polished support 2 using a technique known in the art, as described, for example, in the document "Silicon Processing for the VLSI Era", Vol. 1, Process technology; S. Wolf and R. N. Tauber, Lattice press, chapter 6 (FIG. 2*a*), which is incorporated by reference herein in its entirety.

The surface of the amorphous silicon layer 6 is then lightly polished mechanically and chemically to remove approximately 1000 Å of amorphous silicon.

A monocrystalline silicon substrate 8 is then brought into contact with the polished free surface of the amorphous silicon layer 6 to form a bond by the direct bonding techniques known in the art (FIG. 2*b*). For more details on these bonding techniques, see for example Q.-Y. Tong and U. Gösele, "Semiconductor Wafer Bonding, Science and Technology", The Electrochemical Society Series, Wiley Inter-Science, New-York 1999, which is incorporated by reference herein in its entirety.

Table 1 below sets out the results of bonding a support 2 and a monocrystalline silicon substrate 8 with and without an amorphous silicon layer 6 between them.

TABLE 1

| | | WITH amorphous silicon deposit | |
|---|---|---|---|
| | WITHOUT amorphous silicon deposit | Without polishing of amorphous silicon layer 6 | With polishing of amorphous silicon layer 6 |
| Poly-crystalline silicon already polished with some degree of quality | – | + | ++ |
| Coarsely polished poly-crystalline silicon | –– | – | ++ |

The codes used in table 1 to denote the quality of bonding are as follows:
–– Difficult or partial bonding, with many unbonded areas.
– Partial bonding, with a few non-bonded areas.
+ Total bonding, with few bonding defects observable by infra-red transmission.
++ Total bonding, with no bonding defects observable by infra-red transmission.

Table 1 shows that the bond is really satisfactory only if an amorphous silicon layer 6 is deposited on the polycrystalline silicon support 2. The bond is even better if the amorphous silicon layer 6 is polished, as in the embodiment described with reference to FIG. 2.

In the second embodiment of the invention, shown in FIG. 3, a monocrystalline silicon layer 10 is transferred from a monocrystalline source substrate 12.

As in the embodiment described above, a polycrystalline silicon support 2 is polished. A 3000 Å thick amorphous silicon layer 6 is then deposited on the support 2. The free surface of the amorphous silicon layer 6 is then lightly polished mechanically and chemically to remove approximately 500 Å of amorphous silicon (FIG. 3*a*).

A monocrystalline source substrate 12 is implanted with atoms of hydrogen, for example, using, for example, the methods described in U.S. Pat. No. 5,374,564 (mentioned above) or a variant of those methods.

The expression "implanted with atoms" refers to any bombardment with atomic, molecular or ionic species in order to insert those species into a material with a maximum concentration of those species in the material at a particular depth relative to the bombarded surface. The atomic, molecular or ionic species are inserted into the material with an energy that is also distributed about a maximum. Atomic species can be implanted in the material using an ion beam implanter, an implanter operating by immersion in a plasma, etc.

The implantation generates a fragile area 14.

The source substrate 12 made fragile in this way is then brought into contact with the polished free surface of the amorphous silicon layer 6 to form a bond by direct bonding (FIG. 3*b*). The whole or part of the combination of the support 2 and the source substrate 12 is then subjected to an action that detaches the monocrystalline silicon layer 10 from the source substrate 12 in the fragile area 14.

Generally speaking, the action just referred to can consist of applying mechanical stresses (shear, traction, compression, ultrasound, etc.), stresses produced electrically (application of an electrostatic or electromagnetic field), stresses produced by means of thermal energy (radiation, convection, conduction, increase of pressure in microcavities, etc.), and so on. It can also consist of directing a continuous or varying jet of fluid (liquid or gas) onto the interface at which the active layer 10 and the source substrate 12 separate. In particular, stresses of thermal origin can result from the application of an electromagnetic field, an electron beam, thermoelectric heating, a cryogenic fluid, a supercooled liquid, etc.

The monocrystalline silicon layer 10 is therefore transferred onto the support 2 by direct bonding via the amorphous silicon layer 6.

Variants of the above embodiment can use other implantation techniques (for example plasma implantation) and/or other techniques for transferring a thin layer. Implantation can also be effected in an area made fragile by mechanical means, for example a porous area.

In the third embodiment of the invention, shown in FIG. 4, a silicon on insulator substrate is made. In this embodiment, a polycrystalline silicon support 2 covered with an amorphous silicon layer 6 (FIG. 4*a*) is produced in the same manner as described with reference to the two embodiments disclosed above.

A thermal oxide layer 16 is also formed on a substrate 12 using a technique known to the skilled person. As indicated for the second embodiment, atomic species are implanted in the source monocrystalline silicon substrate 12 to create a fragile area 14.

The substrate 12 is then brought into contact with the support 2 so that the silicon oxide layer 16 lies against the amorphous silicon layer 6 (FIG. 4*b*).

The oxide layer 16 and the monocrystalline silicon layer 10 are then detached from the source substrate 12 in a similar manner to that described for the second embodiment, to form a silicon on insulator substrate. The silicon on insulator substrate is made up of a stack of successive layers: a polycrystalline silicon support 2, an amorphous silicon layer 6, a silicon oxide layer 16 and a monocrystalline silicon layer 10.

In the fourth embodiment of the invention, shown in FIG. 5, a silicon on insulator substrate is also made. To this end, a silicon wafer 3 is assembled with a silicon substrate 12 incorporating a silicon oxide layer 16 and implanted as described above to form a fragile area 14. However, in this case, the silicon oxide layer 16 is too thin (typically less than 1000 Å thick) to absorb degassed species during subsequent operation and which degrade the bond. To prevent bubbles forming at the bonding interface as a consequence of degassing, a polycrystalline silicon layer 5 is formed on the wafer 3 to absorb the degassed species. Because there are no techniques available for polishing the polycrystalline material enabling a satisfactory bond to be obtained, to alleviate the drawbacks of the polycrystalline material in terms of surface roughness an amorphous material layer 6 is then deposited on the polycrystalline material (FIG. 5*a*). Note that if technology develops favorably in the future, deposition of the amorphous material layer 6 could become optional. For the embodiment of the method according to the invention described here, the polycrystalline material 5 is advantageously polycrystalline silicon and the amorphous material 6 is advantageously amorphous silicon.

The support 2, consisting of the wafer 3 and the polycrystalline silicon layer 5 and the amorphous layer 6, and the silicon substrate 12 incorporating the silicon oxide layer 16 are brought into contact and assembled by direct bonding (FIG. 5*b*).

The oxide layer 16 and the monocrystalline silicon layer 10 are then detached from the source substrate 12 in a similar manner to that described for the second and third embodiments to form a silicon on insulator substrate (FIG. 5*c*).

The fourth embodiment of a method in accordance with the invention produces a silicon on insulator substrate including, stacked in succession, a monocrystalline silicon wafer 3 covered with a polycrystalline silicon layer 5 itself covered with an amorphous silicon layer 6 and then a silicon oxide layer 16 and a monocrystalline silicon layer 10.

In a different embodiment, the polycrystalline silicon layer 5 can be deposited on the oxide 16 before forming an amorphous silicon layer, rather than on the support 2. It can equally well be deposited both on the support 2 and on the oxide layer 16.

In a variant of the third and fourth embodiments, an oxide layer can be formed on the support 2, for example on the amorphous material layer 6. This oxide layer can replace the oxide layer 16 covering the monocrystalline material layer 10, but can equally well be provided in addition to the oxide layer 16 covering the monocrystalline material layer 10.

In a variant of the third and fourth embodiments, the silicon can be replaced by silicon carbide.

Also, generally speaking, the oxide layer or layers can be replaced by another insulator (for example a nitride).

In the fifth embodiment of the invention, shown in FIG. 6, a substrate is made including an active layer 9 of monocrystalline silicon carbide on polycrystalline silicon carbide. To this end a polycrystalline silicon carbide support 7 and a monocrystalline silicon carbide source substrate 13 incorporating a fragile area 14 obtained as described above are prepared. As there are as yet no techniques for polishing the polycrystalline material capable of achieving a satisfactory bond, to alleviate the drawbacks of the polycrystalline material in terms of surface roughness an amorphous material layer 6 is then deposited on the polycrystalline silicon carbide support 7 (FIG. 6*a*). Note that polycrystalline silicon carbide can advantageously absorb the degassed species, as explained above. Note again that if technology evolves favorably in the future, deposition of the amorphous material layer 6 may become optional. For the embodiment of the method according to the invention described here, the amorphous material 6 is advantageously amorphous silicon.

The support 7 and the substrate 13 are brought into contact and assembled by direct bonding (FIG. 6*b*).

An action is then applied to detach the monocrystalline silicon carbide layer 9 from the silicon carbide source substrate 13, in a similar manner to that described with reference to the second, third and fourth embodiments, so as to form a substrate incorporating a monocrystalline silicon carbide active layer 9 on a polycrystalline silicon carbide support 7 (FIG. 6*c*).

In a sixth embodiment of the invention, shown in FIG. 7, a substrate is made incorporating a monocrystalline silicon active layer 15 of good quality, i.e., a quality corresponding to a low level of defects, on a monocrystalline silicon support 17 of less good quality, for example a quality that corresponds to that of a material obtained by epitaxial growth, a so-called "perfect crystal" material or any other material that may in the future correspond to a quality optimized relative to what can be achieved at the time of filing this application. This quality corresponds to a material that is used for its electronic and/or optical, etc. properties and has been optimized accordingly. A silicon source substrate 18 of good quality is prepared with a fragile area 14 formed in a similar manner to that described above.

To alleviate the drawbacks of bubbles forming because of degassing products, a polycrystalline silicon layer 5 is advantageously formed on the monocrystalline silicon support 17 of less good quality to absorb the degassed species. Because there are not as yet any techniques for polishing the polycrystalline material enabling a satisfactory bond to be obtained, to alleviate the drawbacks of the polycrystalline material in terms of surface roughness. An amorphous material layer 6 is then deposited on the polycrystalline material (FIG. 7*a*). Note that if technology evolves favorably in the future, deposition of the amorphous material layer 6 could become optional. For the embodiment of the method according to the invention described here, the amorphous material 6 is advantageously amorphous silicon.

The support 17 and the substrate 18 are brought into contact and assembled by direct bonding (FIG. 7*b*).

The monocrystalline silicon layer 15 of good quality is then detached from the silicon source substrate 18 of good quality in a manner similar to that described for the second, third, fourth and fifth embodiments to form a substrate incorporating a monocrystalline silicon active layer 15 of good quality on a monocrystalline silicon support 17 of less good quality (FIG. 6*c*).

Many variants of the embodiments of the invention described above can be envisaged.

Thus the supports 2, 7, 17 provided with an amorphous material layer 6 can, before bonding them to the substrate 8 or a source substrate 12, 13, 18, undergo various conventional treatments known in the amorphous silicon art, in particular hydrogenation or degassing, and various heat treatments, such as a densification heat treatment, for example.

The amorphous silicon layer can advantageously be doped to improve its electrical performance.

The combination of the active layer and its support can also be annealed after assembly, during which process at least partial crystallization of the amorphous material layer 6 can occur.

Moreover, in the embodiments described above, the amorphous material layer 6 is a layer of amorphous silicon, but many other amorphous materials can be envisaged for use in methods according to the present invention. Silicides may be cited by way of example, such as titanium silicide $TiSi_2$ or palladium silicide $Pd_2Si$.

Similarly, what is described above with reference to applications for fabricating substrates including a silicon carbide active layer or 300 mm diameter silicon substrates can be generalized to many other materials without departing from the scope of the invention.

In particular, the invention is advantageous in all cases where it is not yet known how to perform polishing to obtain a surface quality of a polycrystalline material sufficient for direct bonding.

Finally, all the features of the method in accordance with the invention described above can be taken independently or in combination to define new embodiments of the invention.

What is claimed is:

1. An optic, optoelectronic, or electronic substrate comprising:

a first layer of a first material;

a second layer of a second material;

an insulator layer between the first and second layers; and a deposited layer of electrically conductive amorphous material that is present between the first and second layer for direct bonding of the first and second layers together, wherein the first layer, the second layer, and the deposited layer are substantially coextensive.

2. The substrate of claim 1, wherein the first material is a polycrystalline silicon, the second material is a monocrystalline silicon and the insulator layer is in direct contact with the second material and the amorphous material.

3. The substrate of claim 1, wherein the insulator layer has a thickness of less than 1000 Å.

4. The substrate of claim 1, wherein either the first or second layer, or both, comprises a polycrystalline face.

5. The substrate of claim 1, wherein the first layer is a polycrystalline SiC.

6. The substrate of claim 2, wherein each layer has a diameter of about 300 mm.

7. An optic, optoelectronic, or electronic substrate comprising:

a first layer of a first material;

a second layer of a second material; and a deposited layer of electrically conductive amorphous material that is present between the first and second layer for direct bonding of the first and second layers together, wherein the first layer, the second layer, and the deposited layer are substantially coextensive and in which no bonding defects are observable by infrared transmission.

8. The substrate of claim 7, wherein either the first or second layer, or both, comprises a polycrystalline face.

9. The substrate of claim 7, wherein the electrically conductive amorphous material is in direct contact with both the first and second layers.

10. The substrate of claim 7, wherein each layer has a diameter of about 300 mm.

11. The substrate of claim 7, further comprising an insulator layer in contact with the first or second layer.

12. The substrate of claim 9, wherein the first layer is a polycrystalline SiC.

13. The substrate of claim 12, wherein the second material is a monocrystalline silicon.

14. The substrate of claim 11, wherein the insulator layer is in direct contact with the second material and the amorphous material.

* * * * *